(12) United States Patent
Hsu et al.

(10) Patent No.: US 10,714,934 B2
(45) Date of Patent: Jul. 14, 2020

(54) ELECTROSTATIC DISCHARGE PROTECTION DEVICE, DETECTION CIRCUIT AND PROTECTION METHOD THEREOF

(71) Applicant: Realtek Semiconductor Corporation, Hsinchu (TW)

(72) Inventors: Hsin-Cheng Hsu, Hsinchu County (TW); Tay-Her Tsaur, Hsinchu County (TW); Po-Ching Lin, Hsinchu County (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 508 days.

(21) Appl. No.: 15/702,745

(22) Filed: Sep. 12, 2017

(65) Prior Publication Data

US 2018/0301898 A1    Oct. 18, 2018

(30) Foreign Application Priority Data

Apr. 14, 2017   (TW) .............................. 106112648 A (51) Int. Cl.
*H02H 9/04*      (2006.01)
*H02H 1/00*      (2006.01)
*H01L 27/02*     (2006.01)
*H01L 23/528*    (2006.01)

(52) U.S. Cl.
CPC ......... *H02H 9/046* (2013.01); *H01L 27/0266* (2013.01); *H01L 27/0285* (2013.01); *H02H 1/0007* (2013.01); *H01L 23/5286* (2013.01)

(58) Field of Classification Search
CPC ............. H01L 23/5286; H01L 27/0248; H01L 27/0266; H01L 27/0285; H01L 27/0629; H01L 27/092; H01L 2924/00; H01L 2924/0002; H02H 1/0007; H02H 9/046
See application file for complete search history.

(56) References Cited

U.S. PATENT DOCUMENTS 7,098,511 B2 *   8/2006  Ker ...................... H01L 27/0251
                                                          257/360
7,221,551 B2 *   5/2007  Chen ................... H01L 27/0266
                                                          361/111
7,397,280 B2 *   7/2008  Ker ...................... H01L 27/0266
                                                          326/68

(Continued)

FOREIGN PATENT DOCUMENTS

CN    104979814 A    10/2015
TW    201340522 A    10/2013

*Primary Examiner* — Jared Fureman
*Assistant Examiner* — Nicolas Bellido
(74) *Attorney, Agent, or Firm* — CKC & Partners Co., LLC (57) ABSTRACT

An ESD protection device includes a detection circuit and a clamping circuit. The detection circuit is configured to output a first control signal and a second control signal according to a first voltage and a second voltage that is different from the first voltage, in which if an ESD event occurs, the detection circuit is configured to perform an inverse operation according to the second voltage, in order to generate the first control signal and the second control signal. The clamping circuit is configured to be turned on according to the first control signal and the second control signal, in order to provide a discharging path for a current associated with the ESD event.

20 Claims, 6 Drawing Sheets

(56) References Cited

U.S. PATENT DOCUMENTS

| | | | | |
|---|---|---|---|---|
| 8,059,376 B2 * | 11/2011 | Chen | ................... | H02H 9/046 361/118 |
| 2005/0134295 A1 * | 6/2005 | Blumenthal | ........... | H02H 9/046 324/677 |
| 2005/0180073 A1 * | 8/2005 | Armer | ................ | H01L 27/0266 361/56 |
| 2005/0275989 A1 * | 12/2005 | Chen | ................... | H01L 27/0266 361/93.1 |
| 2006/0092590 A1 * | 5/2006 | Chuang | .............. | H01L 27/0285 361/91.1 |
| 2007/0103825 A1 * | 5/2007 | Ker | .................... | H01L 27/0266 361/56 |
| 2012/0081820 A1 * | 4/2012 | Chu | ...................... | H02H 9/046 361/56 |
| 2012/0182654 A1 * | 7/2012 | Wang | .................... | H02H 9/046 361/56 |
| 2013/0141825 A1 * | 6/2013 | Kitagawa | .............. | H02H 9/046 361/56 |
| 2013/0182359 A1 * | 7/2013 | Jeon | ...................... | H02H 9/046 361/56 |

* cited by examiner

ELECTROSTATIC DISCHARGE PROTECTION DEVICE, DETECTION CIRCUIT AND PROTECTION METHOD THEREOF

RELATED APPLICATIONS

This application claims priority to Taiwan Application Ser. No. 106112648, filed Apr. 14, 2017, which is herein incorporated by reference.

BACKGROUND

Technical Field

The present disclosure relates to an electrostatic discharge protection device. More particularly, the present disclosure relates to an electrostatic discharge protection device that employs nominal components and a detection circuit thereof.

Description of Related Art

Generally, an integrated circuit is implemented with one or more transistors. With the development of the manufacturing process, the size of the transistors is significantly reduced. As a result, a voltage that can be withstood by any two terminals of the transistor becomes lower. In order to prevent the integrated circuit from being damaged by an over voltage stress, which is introduced from an electrostatic discharge event, an electrostatic discharge protection circuit is normally utilized.

SUMMARY

An aspect of the present disclosure is to provide an electrostatic discharge (ESD) protection device. The ESD protection device includes a detection circuit and a clamping circuit. The detection circuit is configured to output a first control signal and a second control signal according to a first voltage and a second voltage that is different from the first voltage, in which the detection circuit is configured to perform an inverse operation according to the second voltage in order to generate the first control signal and the second control signal if an ESD event occurs. The clamping circuit is configured to be turned on according to the first control signal and the second control signal, in order to provide a discharging path for a current associated with the ESD event.

An aspect of the present disclosure is to provide an ESD detection circuit. The ESD detection circuit includes a first resistive component, a first coupling component, an inverter, and a first switch. The first resistive component is configured to receive a first voltage. The first coupling component is configured to receive a second voltage that is different from the first voltage, in which the first coupling component and the first the resistive component are coupled to a first node, and the first coupling component is further configured to transmit the second voltage to the first node if an ESD event occurs. The inverter is configured to generate a first control signal according to a first voltage level of the first node. The first switch is configured to be turned on according to the second voltage and the first control signal, in order to output the first control signal as a second control signal, in which the first control signal and the second control signal are configured to control a clamping circuit, in order to bypass a current associated with the ESD event.

An aspect of the present disclosure is to provide an ESD protection method that includes: outputting, by a detection circuit, a first control signal and a second control signal according to a first voltage and a second voltage that is different from the first voltage, in which an inverse operation is performed by the detection circuit according to the second voltage in order to generate the first control signal and the second control signal if an ESD event occurs; and turning on a clamping circuit according to the first control signal and the second control signal, in order to provide a discharging path for a current associated with the ESD event.

As described above, the ESD protection device, the detection circuit, and the method thereof provided in this disclosure can be implemented with components that withstand the nominal voltage, and can provide the discharging path when the ESD event occurs, in order to improve the reliability of the internal components.

BRIEF DESCRIPTION OF THE DRAWINGS

This disclosure can be more fully understood by reading the following detailed description of the embodiment, with reference made to the accompanying drawings as follows.

DETAILED DESCRIPTION

The following embodiments are disclosed with accompanying diagrams for detailed description. For illustration clarity, many details of practice are explained in the following descriptions. However, it should be understood that these details of practice do not intend to limit the present disclosure. That is, these details of practice are not necessary in parts of embodiments of the present embodiments. Furthermore, for simplifying the drawings, some of the conventional structures and elements are shown with schematic illustrations.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

In this document, the term "coupled" may also be termed as "electrically coupled," and the term "connected" may be termed as "electrically connected." "Coupled" and "connected" may mean "directly coupled" and "directly connected" respectively, or "indirectly coupled" and "indirectly connected" respectively. "Coupled" and "connected" may also be used to indicate that two or more elements cooperate or interact with each other.

Figure 1:
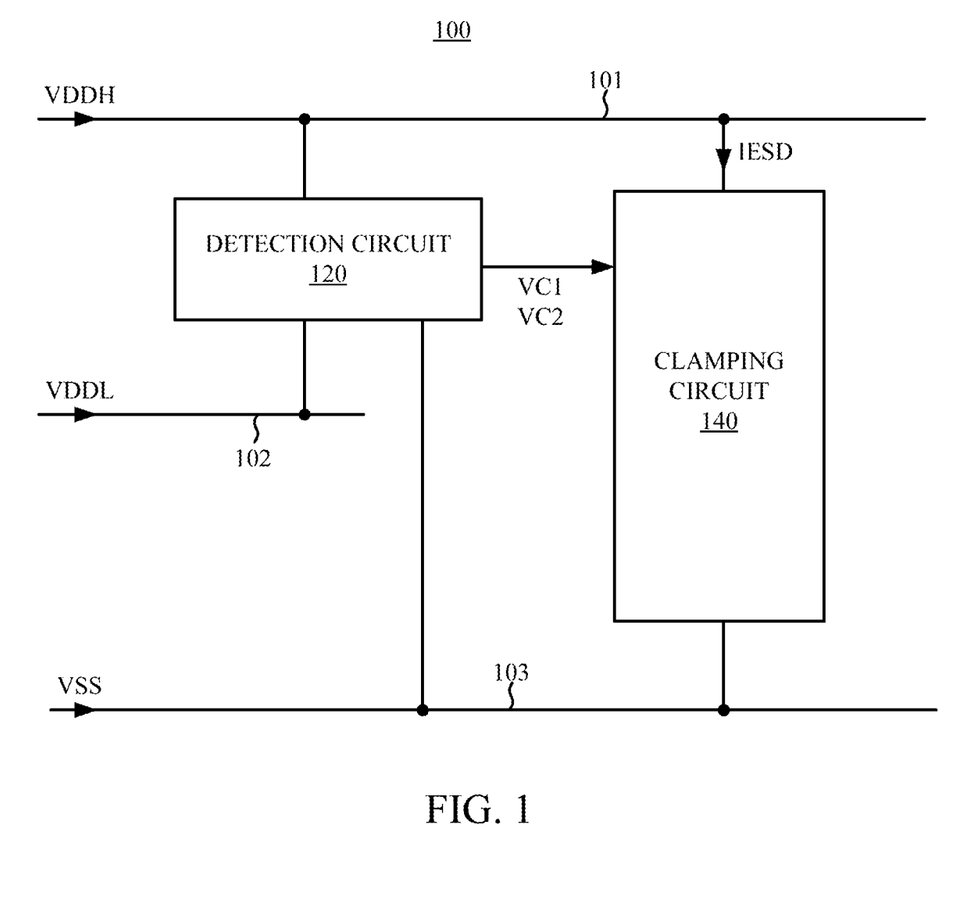
FIG. 1 is a schematic diagram of an Electrostatic Discharge (ESD) protection device, according to some embodiments of the present disclosure.

Reference is made to FIG. 1. FIG. 1 is a schematic diagram of an Electrostatic Discharge (ESD) protection device 100, according to some embodiments of the present disclosure. In some embodiments, the ESD protection device 100 can be applied to various electronic devices, integrated circuits, or chips, in order to increase the reliability of these elements.

In some embodiments, the ESD protection device 100 includes a detection circuit 120 and a clamping circuit 140. The detection circuit 120 and the clamping circuit 140 are coupled between a power rail 101, a power rail 102, and a power rail 103. In some embodiments, the power rail 101 is configured to provide a voltage VDDH, and the power rail 102 is configured to provide a voltage VDDL, in which the voltage VDDH is different from the voltage VDDL. In some embodiments, the power rail 103 is configured to provide a ground voltage VSS.

In some embodiments, the voltage VDDL is lower than the voltage VDDH. For example, in some applications, the voltage VDDH is about 3.3 volts (V), and the voltage VDDL is about 1.8V. In some embodiments, the ground voltage VSS is lower than the voltage VDDH or the voltage VDDL. For example, in some applications, the ground voltage VSS is about 0V. The values of these voltages are given for illustrative purposes only. Various values of the voltage VDDH, VDDL, or VSS are within the contemplated scope of the present disclosure.

The detection circuit 120 is coupled between the power rail 101 and the power rail 102, and is configured to output a control signal VC1 and a control signal VC2 according to the voltage VDDH and the voltage VDDL. In some embodiments, if an ESD event occurs, the detection circuit 120 is configured to perform an inverse operation according to the voltage VDDL, in order to generate the control signal VC1 and the control signal VC2. In some embodiments, signal values of the control signal VC1 and the control signal VC2 can be configured to indicate whether the ESD event occurs. The related description is provided with reference to FIG. 3 and FIG. 4 below.

The clamping circuit 140 is coupled between the power rail 101 and the power rail 103, and is configured to be turned on according to the control signal VC1 and the control signal VC2, in order to provide a discharging path for a current IESD associated with the ESD event.

Figure 2:
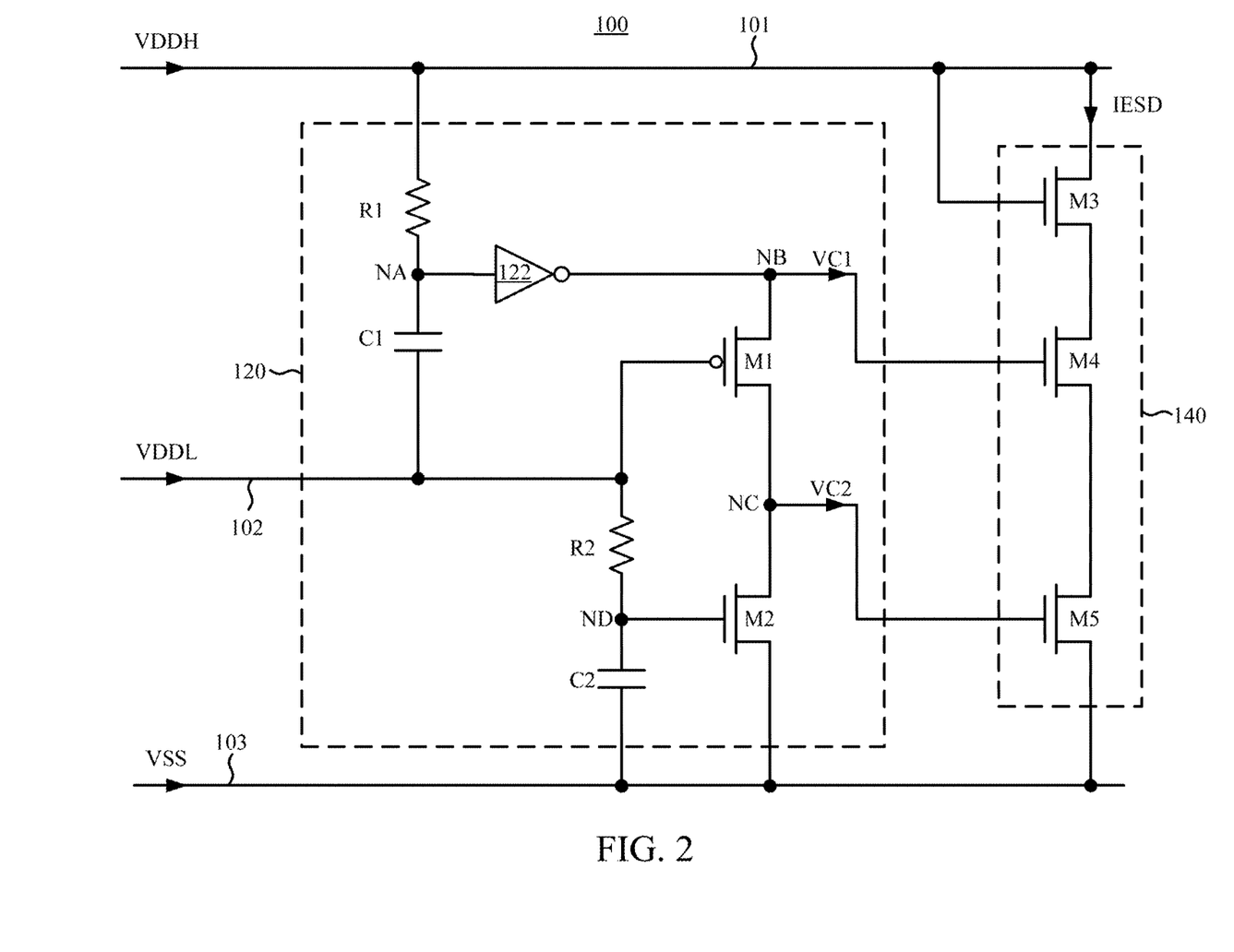
FIG. 2 is a circuit diagram of the ESD protection device in FIG. 1, according to some embodiments of the present disclosure.

Reference is made to FIG. 2. FIG. 2 is a circuit diagram of the ESD protection device 100 in FIG. 1, according to some embodiments of the present disclosure. For ease of understanding, like elements in FIG. 2 are designated with the same reference numbers with respect to FIG. 1.

In some embodiments, the detection circuit 120 includes resistive components R1-R2, coupling components C1-C2, an inverter 122, switches M1-M2. In some embodiments, the coupling components C1-C2 are configured to provides paths which are able to couple AC signals. For example, the coupling components C1-C2 may be implemented with capacitive components. In some embodiments, the resistive components R1-R2 may be implemented with various active or passive components, which include, for example, passive resistors, on-chip resistors, or transistors. The implementations of these components are given for illustrative purposes only. Various implementations able to implement these components are within the contemplated scope of the present disclosure.

As shown in FIG. 2, a terminal of the resistive component R1 is coupled to the power rail 101 to receive the voltage VDDH, and another terminal of the resistive component R1 and a terminal of the coupling component C1 are coupled to a node NA. Another terminal of the coupling component C1 is coupled to the power rail 102 to receive the voltage VDDL. The inverter 122 is operated between the voltage VDDH and the voltage VDDL. An input terminal of the inverter 122 is coupled to the node NA, and an output terminal of the inverter 122 is coupled to a node NB. In some embodiments, inverter 122 is configured to, according to a voltage level of the node NA, output the control signal VC1 to the node NB.

In some embodiments, the switch M1 is implemented with a P-type transistor. As shown in FIG. 2, a first terminal of the switch M1 is coupled to the node NB to receive the control signal VC1, a second terminal of the switch M1 is coupled to a node NC, and a control terminal of the switch M1 is coupled to the power rail 102 to receive the voltage VDDL. The switch M1 is configured to be turned on according to the voltage VDDL and the control signal VC1, in order to output the control signal VC1 as the control signal VC2 to the node NC.

A terminal of the resistive component R2 is coupled to the power rail 102 to receive the voltage VDDL, and another terminal of the resistive component R2 is coupled to a node ND. The coupling component C2 is coupled between the node ND and the power rail 103, in order to receive the ground voltage VSS. In some embodiments, the switch M2 is implemented with an N-type transistor. As shown in FIG. 2, a first terminal of the switch M2 is coupled to the node NC, a second terminal of the switch M2 is coupled to the power rail 103 to receive the ground voltage VSS, and a control terminal of the switch M2 is coupled to the node ND. In some embodiments, the switch M2 is configured to adjust a resistance value thereof according to a voltage level of the node ND, in order to adjust the voltage level of the control signal VC2. In some embodiments, the resistive component R2, the coupling component C2 and the switch M2 may be replaced with another resistive component that is coupled between the node NC and the ground voltage VSS.

The clamping circuit 140 includes switches M3-M5 which are coupled in series. In some embodiments, the switches M3-M5 may be implemented with N-type transistors. The switch M3 is configured to reduce the voltage of a first terminal of the switch M4, a first terminal and a control terminal of the switch M3 are coupled to the power rail 101, and a second terminal of the switch M3 is coupled to the first terminal of the switch M4. A second terminal of the switch M4 is coupled to a first terminal of a first terminal of the switch M5, and a control terminal of the switch M4 is coupled to the node NB to receive the control signal VC1. In some embodiments, the switch M4 is configured to be selectively turned on according to the control signal VC1. The switch M5 is coupled between the second terminal of the switch M4 and the power rail 103, and a control terminal of the switch M5 is coupled to the node NC to receive the control signal VC2. In some embodiments, the switch M5 is configured to be selectively turned on according to the control signal VC2.

Figure 3A:
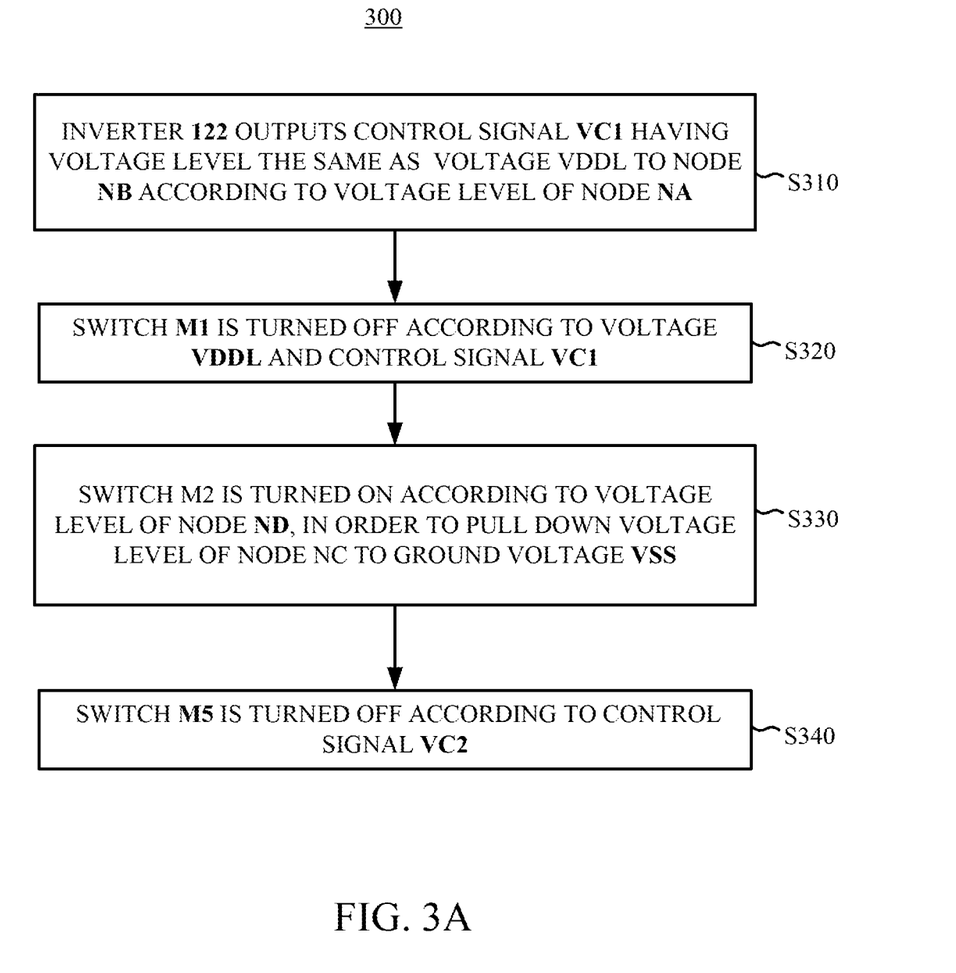
FIG. 3A is a flow chart illustrating a method performed by the ESD protection device under a normal condition, according to some embodiments of present disclosure.
Figure 3B:
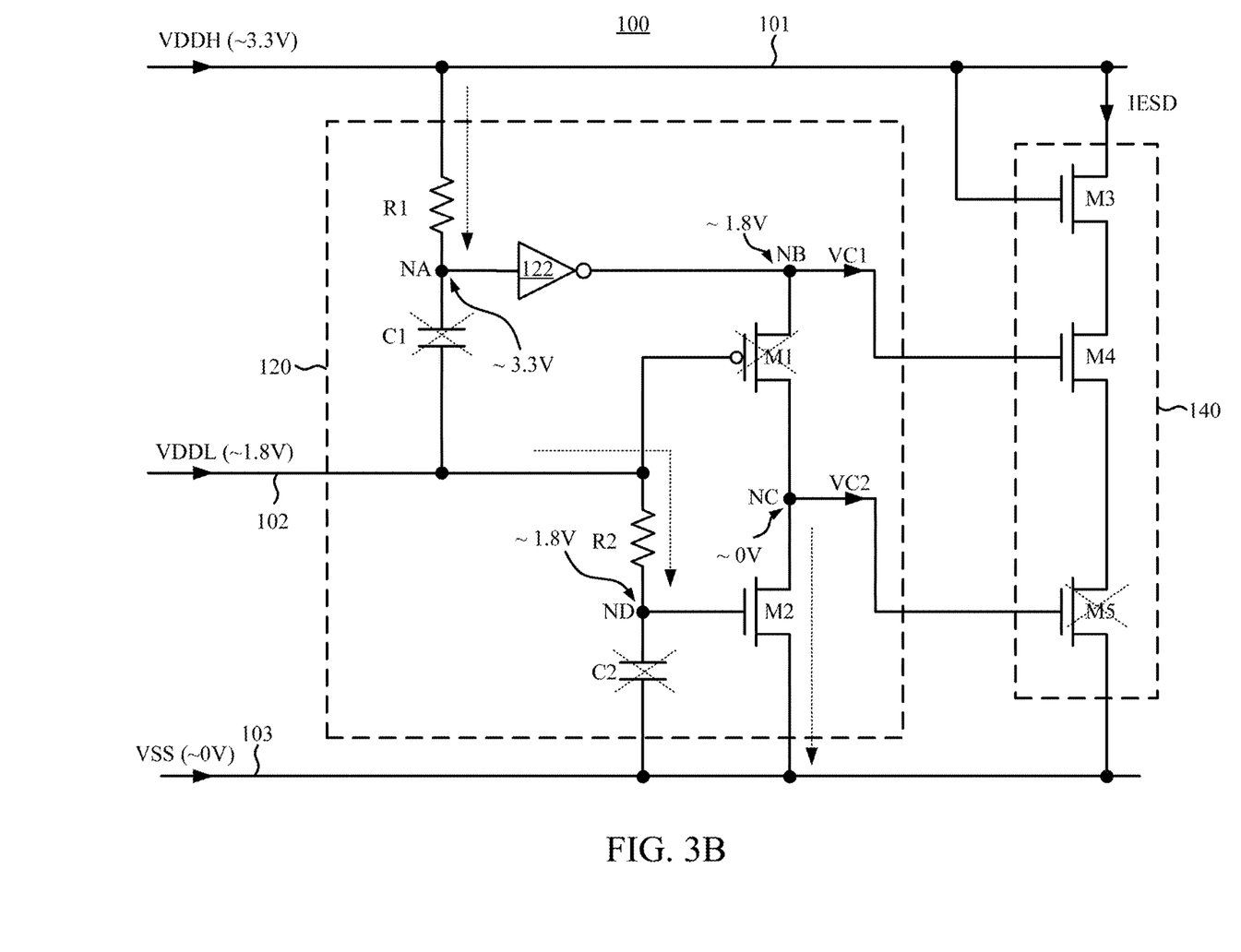
FIG. 3B is a schematic diagram illustrating the operating status of the ESD protection device performing the method in FIG. 3A, according to some embodiments of the present disclosure.

Reference is made to FIG. 3A and FIG. 3B. FIG. 3A is a flow chart illustrating a method 300 performed by the ESD protection device 100 under a normal condition, according to some embodiments of present disclosure. FIG. 3B is a schematic diagram illustrating the operating status of the ESD protection device 100 performing the method 300, according to some embodiments of the present disclosure.

For ease of understanding, FIG. 3B shows reference values of various voltages, but the present disclosure is not limited to these values.

In operation S310, the inverter 122 outputs the control signal VC1 having a voltage level the same as the voltage VDDL to the node NB according to the voltage level of the node NA. For example, when the ESD event does not occur, a transient signal (which is, for example, a spike voltage or the current IESD) is not present in the power rail 101. Under this condition, the coupling components C1-C2 do not transmit signals to the corresponding nodes. Therefore, the voltage level of the node NA is kept at the voltage VDDH (e.g., 3.3V) via the resistive component R1. Accordingly, the inverter 122 outputs the control signal VC1 having the voltage level of 1.8V.

In operation S320, the switch M1 is turned off according to the voltage VDDL and the control signal VC1. In operation S330, the switch M2 is turned on according to the voltage level of the node ND, in order to pull down the voltage level of the node NC to the ground voltage VSS. For example, the voltage levels of the control signal VC1 and the voltage VDDL are 1.8V, and thus the switch M1 is turned off. As described above, when the ESD event does not occur, the coupling component C2 cannot transmit the signal, and thus the voltage level of the node ND is kept at the voltage VDDL via the resistive component R2. Therefore, the switch M2 is turned on to pull down the voltage level of the node NC to the ground voltage VSS (e.g., 0V). In other words, in operation S330, the resistance value of the switch M2 is adjusted to a low resistance value to provide a path for transmitting signal. Effectively, with operations S320 and S330, the detection circuit 120 outputs the control signal VC2 having the voltage level the same as the ground voltage VSS.

In operation S340, the switch M5 is turned off according to the control signal VC2. As mentioned above, the voltage level of the control signal VC2 is the same as the ground voltage VSS, and thus the switch M5 is turned off to not provide the discharging path. In some embodiments, the switch M3 is normally on, and the switch M4 can be turned on or off according to a threshold value of a practical switch. Therefore, no matter whether the switch M4 is turned on or off, in this example, the discharging path provided by the clamping circuit 140 is cut off by the switch M5. In other words, when operating under the normal condition (i.e., the ESD event does not occur), the clamping circuit 140 is not turned on. Accordingly, when operating under the normal condition, it is able to prevent a leakage current from flowing from the power rail 101 to the power rail 103.

Figure 4A:
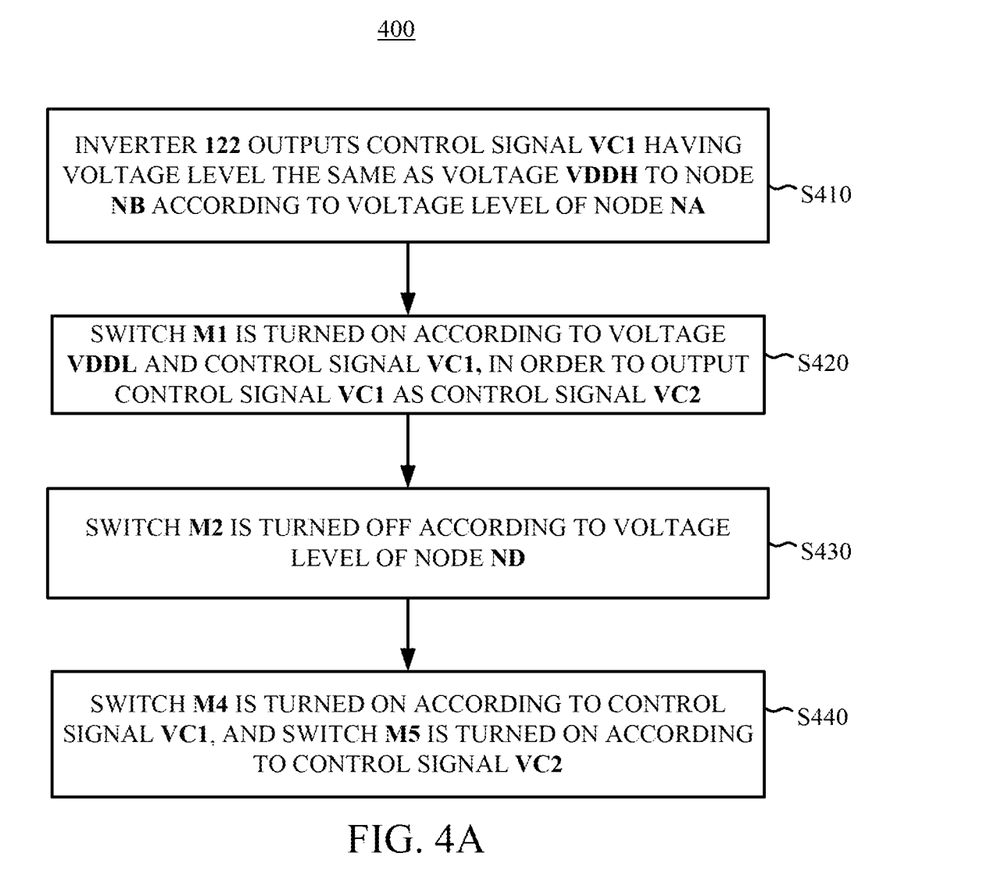
FIG. 4A is a flow chart illustrating a protection method performed by the ESD protection device in FIG. 2 when the ESD event occurs, according to some embodiments of the present disclosure.
Figure 4B:
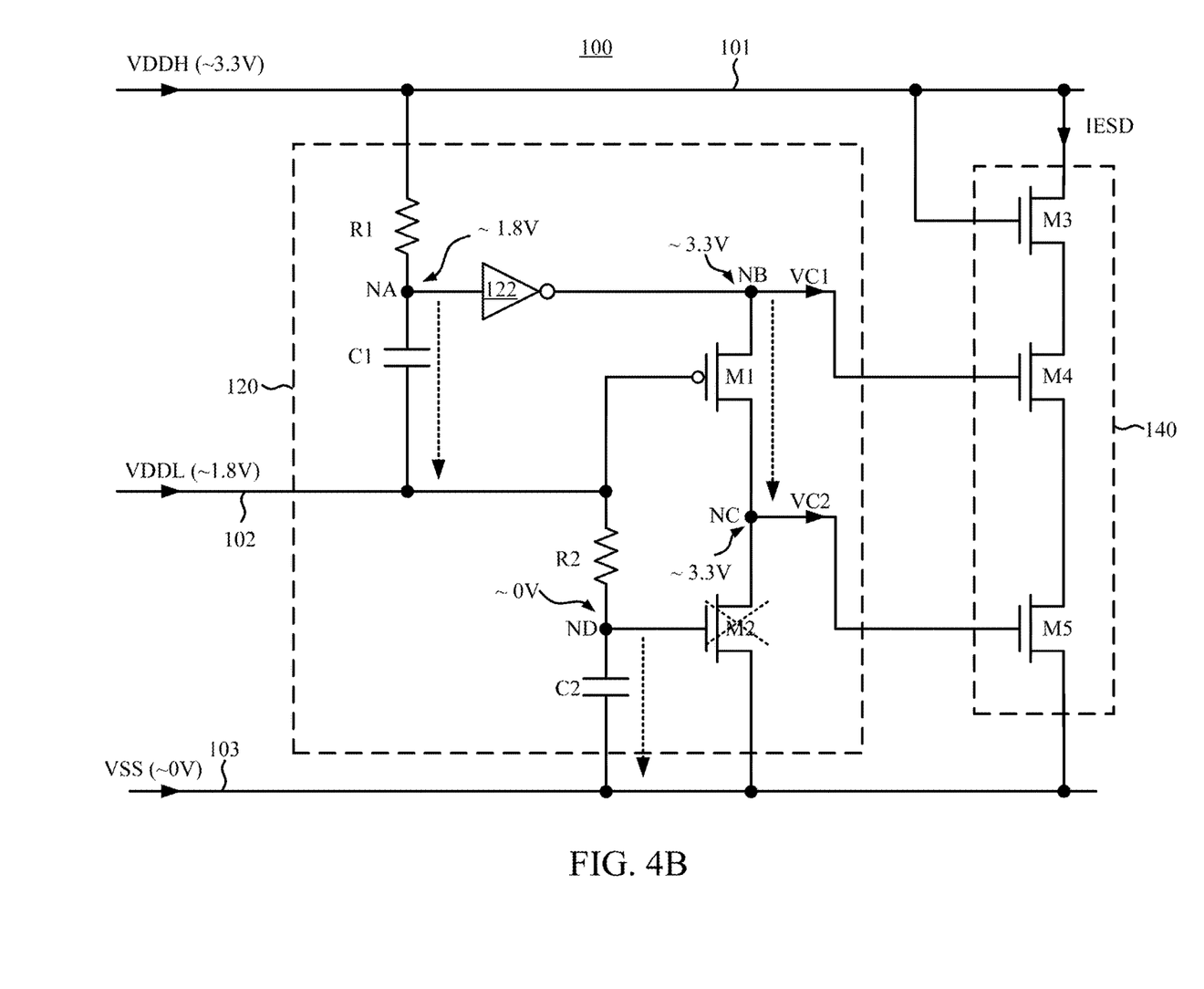
FIG. 4B is a schematic diagram illustrating the operating status of the ESD protection device performing the method in FIG. 4A, according to some embodiments of the present disclosure.

Reference is made to FIG. 4A and FIG. 4B. FIG. 4A is a flow chart illustrating a protection method 400 performed by the ESD protection device 100 in FIG. 2 when the ESD event occurs, according to some embodiments of the present disclosure. FIG. 4B is a schematic diagram illustrating the operating status of the ESD protection device 100 performing the method 400, according to some embodiments of the present disclosure. For ease of understanding, FIG. 4B shows reference values of various voltages, but the present disclosure is not limited to these values.

In operation S410, the inverter 122 outputs the control signal VC1 having the voltage level the same as the voltage VDDH to the node NB according to the voltage level of the node NA. For example, when the ESD event occurs, a transient signal (e.g., the spike voltage or the current IESD) is present in the power rail 101. Under this condition, the coupling components C1-C2 are able to transmit signals to the corresponding nodes. Therefore, the voltage level of the node NA is pulled down to the voltage VDDL via the coupling component C1. Accordingly, the inverter 122 outputs the control signal VC1 having the voltage level of about 3.3V.

In operation S420, the switch M1 is turned on according to the voltage VDDL and the control signal VC1, in order to output the control signal VC1 as the control signal VC2. In operation S430, the switch M2 is turned off according to the voltage level of the node ND. For example, when the voltage level of the control signal VC1 is 3.3V and the voltage VDDL is 1.8V, the switch M1 is turned on. Meanwhile, the voltage level of the node ND is pulled down to the ground voltage VSS via the coupling component C2. As a result, the switch M2 is turned off. In other words, in operation S430, the resistance value of the switch M2 is adjusted to a high resistance value, in order to cut off the signal transmitting path. Effectively, with operations S420 and S430, the detection circuit 120 outputs the control signal VC2 having the voltage level the same as the voltage VDDH.

In operation S440, the switch M4 is turned on according to the control signal VC1, and the switch M5 is turned on according to the control signal VC2. As described above, the switch M3 is normally on. In this example, the control signal VC1 and the control signal VC2 are about 3.3V, and thus the switch M4 and the switch M5 are turned on. In other words, when the ESD event occurs, the clamping circuit 140 is turned on to provide the discharging path for the current IESD. When the ESD event occurs, the current IESD can be bypassed from the power rail 101 to the power rail 103 via the clamping circuit 140. As a result, the transient voltage introduced from the ESD event can be reduced, in order to improve the reliability of internal components of the device.

The above description of the method 300 and the method 400 include exemplary operations, but the operations of the method 300 and the method 400 are not necessarily performed in the order described above. The operations of the method 300 and the method 400 disclosed in the present disclosure can be added, replaced, omitted, or performed in different orders, in accordance with the spirit and scope of various embodiments of the present disclosure.

In various embodiments, the arrangements of the ESD protection device 100 are given for illustrative purposes only. Various implementations and arraignments to implement same functions the same as the ESD protection device 100 are within the contemplated scope of the present disclosure. For example, in some embodiments, the resistive component R2, the coupling component C2 and the switch M2 may be implemented with normal resistors. Alternatively, in some embodiments, the clamping circuit 140 may operate without the switch M3. In some embodiments, the clamping circuit 140 may only include the switch M4 and the switch M5. A number of switches employed in the clamping circuit 140 can be adjusted according to a practical value of the voltage VDDH.

In various embodiments, the conductivity types of the transistors used in the ESD protection device 100 are given for illustrative purposes only. Various conductivity types of the transistors to implement the ESD protection device 100 are within the contemplated scope of the present disclosure. In various embodiments, switch components used in the ESD protection device 100 may be implemented with transistors that withstand a nominal voltage. In some embodiments, with the arrangement of the ESD protection device 100, any two terminals of a transistor may withstand about 110% of the nominal voltage. In some embodiments, the voltage VDDH is about twice as much as the nominal voltage.

As described above, the ESD protection device, the detection circuit, and the method thereof provided in this disclosure can be implemented with components that withstand the nominal voltage, and can provide the discharging path when the ESD event occurs, in order to improve the reliability of the internal components.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. An electrostatic discharge (ESD) protection device, comprising:
   a detection circuit configured to output a first control signal and a second control signal according to a first voltage and a second voltage that is different from the first voltage, wherein if an ESD event occurs, the detection circuit is configured to perform an inverse operation according to the second voltage, in order to generate the first control signal and the second control signal; and
   a clamping circuit configured to be turned on according to the first control signal and the second control signal if the ESD event occurs, in order to provide a discharging path for a current associated with the ESD event,
   wherein if the ESD event does not occur, a voltage level of the second control signal is pulled down to turn off the clamping circuit.

2. The ESD protection device of claim 1, wherein the detection circuit comprises:
   a first resistive component coupled to a first power rail to receive the first voltage;
   a first coupling component coupled to a second power rail to receive the second voltage, wherein the second voltage is lower than the first voltage, the first coupling component and the first resistive component are coupled to a first node, and the first coupling component is further configured to transmit the second voltage to the first node if the ESD event occurs;
   an inverter configured to perform the inverse operation according to a first voltage level of the first node, in order to generate the first control signal and the second control signal; and
   a switch configured to be turned on according to the second voltage and the first control signal if the ESD event occurs, in order to output the first control signal as the second control signal.

3. The ESD protection device of claim 2, wherein the detection circuit further comprises:
   a second resistive component coupled between the switch and a third power rail, the second resistive component configured to adjust the voltage level of the second control signal, wherein the third power rail is configured to provide a ground voltage.

4. The ESD protection device of claim 3, wherein if the ESD does not occur, the voltage level of the second control signal is pulled down to the ground voltage via the second resistive component.

5. The ESD protection device of claim 3, wherein the detection circuit further comprises:
   a third resistive component coupled to the second power rail to receive the second voltage; and
   a second coupling component, wherein the second coupling component and the third resistive component are coupled to a second node, and are configured to pull down a second voltage level of the second node to the ground voltage if the ESD event occurs,
   wherein the second resistive component is further configured to adjust a resistance value of the second resistive component according to the second voltage level.

6. The ESD protection device of claim 2, wherein the inverter is operated between the first voltage and the second voltage.

7. The ESD protection device of claim 2, wherein if the ESD event does not occur, a voltage level of the first control signal is the same as the second voltage, and if the ESD event occurs, the voltage level of the first control signal is the same as the first voltage.

8. The ESD protection device of claim 1, wherein the clamping circuit comprises:
   a first switch coupled to the detection circuit, and configured to be turned on according to the first control signal if the ESD event occurs; and
   a second switch coupled between the first switch and ground in series, and configured to be turned on according to the second control signal if the ESD event occurs,
   wherein the first switch and the second switch form the discharging path.

9. The ESD protection device of claim 8, wherein the clamping circuit further comprises:
   a third switch coupled between a power rail and the first switch, wherein the power rail is configured to provide the first voltage.

10. An electrostatic discharge (ESD) detection circuit comprising:
    a first resistive component configured to receive a first voltage;
    a first coupling component configured to receive a second voltage different from the first voltage, wherein the first coupling component and the first resistive component are coupled to a first node, the first coupling component is further configured to transmit the second voltage to the first node if an ESD event occurs;
    an inverter configured to generate a first control signal according to a first voltage level of the first node; and
    a first switch configured to be turned on according to the second voltage and the first control signal if the ESD event occurs, in order to output the first control signal as a second control signal, wherein the first control signal and the second control signal are configured to control a clamping circuit, in order to bypass a current associated with the ESD event,
    wherein if the ESD event does not occur, a voltage level of the second control signal is pulled down to turn off the clamping circuit.

11. The ESD detection circuit of claim 10, further comprising:
    a second resistive component coupled between the first switch and a power rail, and configured to adjust the voltage level of the second control signal, wherein the power rail is configured to provide a ground voltage.

12. The ESD detection circuit of claim 11, wherein if the ESD event does not occur, the voltage level of the second control signal is pulled down to the ground voltage via the second resistive component.

13. The ESD detection circuit of claim 11, further comprising:
    a third resistive component configured to receive the second voltage; and a second coupling component, wherein the second coupling component and the third resistive component are coupled to a second node, and are configured to pull down a second voltage level of the second node to the ground voltage if the ESD event occurs, wherein the second resistive component is further configured to adjust a resistance value of the second resistive component according to the second voltage level.

14. The ESD detection circuit of claim 10, wherein if the ESD event does not occur, a voltage level of the first control signal is the same as the second voltage, and if the ESD event occurs, the voltage level of the first control signal is the same as the first voltage.

15. An electrostatic discharge (ESD) protection method, comprising:
    outputting, by a detection circuit, a first control signal and a second control signal according to a first voltage and a second voltage different from the first voltage, wherein if an ESD event occurs, an inverse operation is performed by the detection circuit according to the second voltage, in order to generate the first control signal and the second control signal; and
    turning on a clamping circuit according to the first control signal and the second control signal if the ESD event occurs, in order to provide a discharging path for a current associated with the ESD event,
    wherein if the ESD event does not occur, a voltage level of the second control signal is pulled down to turn off the clamping circuit.

16. The ESD protection method of claim 15, wherein outputting the first control signal and the second control signal comprises:
    transmitting, by a first coupling component, the second voltage to a first node if the ESD event occurs;
    performing, by an inverter, the inverse operation according to a first voltage level of the first node, in order to generate the first control signal and the second control signal; and
    turning on a switch according to the according to the second voltage and the first control signal if the ESD event occurs, in order to output the first control signal as the second control signal.

17. The ESD protection method of claim 16, further comprising:
    transmitting, by a first resistive component, the first voltage to the first node if the ESD event does not occur.

18. The ESD protection method of claim 16, further comprising:
    adjusting, by a second resistive component, the voltage level of the second control signal.

19. The ESD protection method of claim 18, wherein the second resistive component is further configured to adjust a resistance value of the second resistive component according to a second voltage level of a second node, and adjusting the voltage level of the second control signal comprises:
    if the ESD event does not occur, transmitting, by a third resistive component, the second voltage to the second node, in order to pull down the voltage level of the second control signal to a ground voltage.

20. The ESD protection method of claim 15, wherein if the ESD event does not occur, a voltage level of the first control signal is the same as the second voltage, and if the ESD event occurs, the voltage level of the first control signal is the same as the first voltage.

* * * * *